(12) United States Patent
Tachikawa

(10) Patent No.: US 7,608,528 B2
(45) Date of Patent: Oct. 27, 2009

(54) SUBSTRATE COVER, AND CHARGED PARTICLE BEAM WRITING APPARATUS AND METHOD

(75) Inventor: Yuichi Tachikawa, Shizuoka (JP)

(73) Assignee: NuFlare Technology, Inc., Numazu-shi (JP)

( * ) Notice: Subject to any disclaimer, the term of this patent is extended or adjusted under 35 U.S.C. 154(b) by 233 days.

(21) Appl. No.: 11/838,465

(22) Filed: Aug. 14, 2007

(65) Prior Publication Data

US 2008/0054195 A1    Mar. 6, 2008

(30) Foreign Application Priority Data

Sep. 1, 2006    (JP)    ............................. 2006-237927

(51) Int. Cl.
  *H01L 21/62*   (2006.01)
  *G21K 5/04*    (2006.01)
(52) U.S. Cl. .................................. 438/487; 250/492.22
(58) Field of Classification Search .................. 250/441; 438/487

See application file for complete search history.

(56) References Cited

U.S. PATENT DOCUMENTS

2008/0268583 A1* 10/2008 Yamazaki et al. ............ 438/151
2009/0115029 A1*  5/2009 Koyama et al. ............. 257/632
2009/0117716 A1*  5/2009 Shimomura et al. ......... 438/487

FOREIGN PATENT DOCUMENTS

JP    5-158218    6/1993

* cited by examiner

*Primary Examiner*—Nikita Wells
*Assistant Examiner*—Johnnie L Smith
(74) *Attorney, Agent, or Firm*—Oblon, Spivak, McClelland, Maier & Neustadt, L.L.P.

(57) ABSTRACT

A substrate cover includes a frame-like member configured to be placed on a substrate which is to be written using a charged particle beam, and to have an outer perimeter dimension larger than a perimeter end of the substrate and an inner perimeter dimension, being a border between the frame-like member and an inner opening portion, smaller than the perimeter end of the substrate, and a contact point part configured to be provided on an undersurface of the frame-like member, in order to be electrically connected to the substrate.

10 Claims, 8 Drawing Sheets

SUBSTRATE COVER, AND CHARGED PARTICLE BEAM WRITING APPARATUS AND METHOD

CROSS-REFERENCE TO RELATED APPLICATION

This application is based upon and claims the benefit of priority from the prior Japanese Patent Application No. 2006-237927 filed on Sep. 1, 2006 in Japan, the entire contents of which are incorporated herein by reference.

BACKGROUND OF THE INVENTION

1. Field of the Invention

The present invention relates to a substrate cover, a charged particle beam writing apparatus, and a charged particle beam writing method. More particularly, for example, the present invention relates to an earth or "grounding" system of a substrate on which a pattern is written using electron beams, a writing apparatus, and a writing method.

2. Description of the Related Art

Microlithography technology which forwards miniaturization of semiconductor devices is extremely important, because only this process performs forming a pattern in semiconductor manufacturing processes. In recent years, with an increase in high integration and large capacity of large-scale integrated circuits (LSI), a circuit line width required for semiconductor elements is becoming narrower and narrower. In order to form a desired circuit pattern on these semiconductor devices, a master pattern (also called a reticle or a mask) with high precision is required. Then, since the electron beam technology for writing or "drawing" a pattern has excellent resolution intrinsically, it is used for manufacturing such high precision master patterns.

FIG. 12 shows a schematic diagram for explaining operations of a conventional variable-shaped electron beam writing apparatus. The variable-shaped electron beam (EB) pattern writing apparatus operates as follows: As shown in the figure, the pattern writing apparatus includes two aperture plates. A first or "upper" aperture plate 410 has an opening or "hole" 411 in the shape of a rectangle for shaping an electron beam 330. This shape of the rectangular opening may also be a square, a rhombus, a rhomboid, etc. A second or "lower" aperture plate 420 has a variable-shaped opening 421 for shaping the electron beam 330 having passed through the opening 411 of the first aperture plate 410 into a desired rectangle. The electron beam 330 that left a charged particle source 430 and has passed through the opening 411 is deflected by a deflector. Then, the electron beam 330 passes through a part of the variable-shaped opening 421 of the second aperture plate 420, and irradiates a target workpiece 340 mounted on a stage that is continuously moving in a predetermined direction (e.g. X-axis direction). In other words, a rectangular shape capable of passing through both of the opening 411 and the variable-shaped opening 421 is written in a pattern writing region of the target workpiece 340 mounted on the stage. This method of writing or "forming" a given variable shape by letting beams pass through both of the opening 411 and the variable-shaped opening 421 is called a variable shaped beam system.

Generally, a target workpiece, such as a mask substrate, is fixed to a stage by a member of a clamping mechanism, for example, on the stage in an electron beam pattern writing apparatus. When a pattern is written on the target workpiece, such as a mask substrate, by the electron beam pattern writing apparatus, an electrical conducting material comprising a layer formed on the surface of the target workpiece, such as a shading film of chromium (Cr), will be charged. If the writing is performed in such a state, the problem arises that the orbit of the electron beam irradiating for writing is bent under the influence of the electrified charge, thereby becoming impossible to write at a desired position. Alternatively, the problem arises that the electron beam becomes blurred. Then, usually, earthing (or "ground connection") is made for the charged layer. In the conventional earthing system, some contact points are allocated on the target workpiece to couple or "connect" the target workpiece charged to ground potential. However, not only the shading film layer is charged. Since the side of the target workpiece is irradiated by a part of the electron beam, a glass substrate etc. exposed on the surface of the side of the target workpiece is also charged.

As to the target workpiece, such as a mask substrate, to be written by the electron beam pattern writing apparatus, it is originally a mask blank where nothing is written. Conventionally, when writing a pattern on such a substrate, an alignment mark is provided on the stage, and alignment for writing is performed by estimating the position of the mask substrate based on the alignment mark position. However, this method is premised on that the relative position between the mask substrate and the stage does not shift. Therefore, even if the mask substrate shifts on the stage, an immediate coping cannot be performed. The position displacement can be checked only by inspecting a finished pattern after the mask substrate has been written and the processing of developing, etching, etc. has been performed.

As to the position alignment method of the mask substrate in the electron beam pattern writing, the technique is disclosed that an alignment mark is beforehand formed on the mask substrate and highly precise alignment is performed between writing the first layer and writing the second layer (refer to, e.g., Japanese Unexamined Patent Publication No. 5-158218 (JP-A-5-158218)). However, in this technique, there is a problem that since the alignment mark needs to be formed on the mask substrate beforehand before writing the pattern, the number of steps is increased because the steps of writing an alignment mark on the mask substrate, developing and etching thereof are added.

As mentioned above, in the electron beam pattern writing apparatus, it is desired to eliminate the influence of the electrified charge of the substrate side upon the orbit of the electron beam irradiating the substrate. Moreover, it is desired to grasp a highly precise position of the substrate even on which the mark is not specially formed.

BRIEF SUMMARY OF THE INVENTION

It is an object of the present invention to provide a mechanism, a method, and an apparatus for reducing the charge electrified on the side of the substrate. Furthermore, it is another object to provide a mechanism and a method of performing writing onto a highly precise position.

In accordance with one aspect of the present invention, a substrate cover includes a frame-like member configured to be placed on a substrate which is to be written using a charged particle beam, and to have an outer perimeter dimension larger than a perimeter end of the substrate and an inner perimeter dimension, being a border between the frame-like member and an inner opening portion, smaller than the perimeter end of the substrate, and a contact point part configured to be provided on an undersurface of the frame-like member, in order to be electrically connected to the substrate.

In accordance with another aspect of the present invention, a charged particle beam writing apparatus includes a stage configured to hold thereon a substrate attached with a substrate cover covering a whole perimeter part of the substrate and including a contact point electrically connected to the substrate, an electric conductive member configured to be electrically connected to the contact point and couple the substrate charged to ground potential, in a state that the substrate is arranged on the stage, and a writing unit configured to write a predetermined pattern onto the substrate by using a charged particle beam, in a state that the substrate is coupled to ground potential by using the electric conductive member.

In accordance with another aspect of the present invention, a charged particle beam writing method includes carrying a substrate attached with a substrate cover with a predetermined mark formed thereon into a pattern writing apparatus, checking a position of the substrate by using the predetermined mark formed on the substrate cover, and writing a predetermined pattern on the substrate whose position has been checked, by using a charged particle beam.

In accordance with another aspect of the present invention, a charged particle beam writing method includes carrying a substrate attached with a substrate cover that covers a whole perimeter part of the substrate into a pattern writing apparatus, and writing a predetermined pattern on the substrate attached with the substrate cover, by using a charged particle beam.

DETAILED DESCRIPTION OF THE INVENTION

In the following Embodiments, there will be described the structure using an electron beam as an example of a charged particle beam. The charged particle beam is not restricted to the electron beam, and then may be a beam using other charged particle, such as an ion beam.

Embodiment 1

Figure 1:
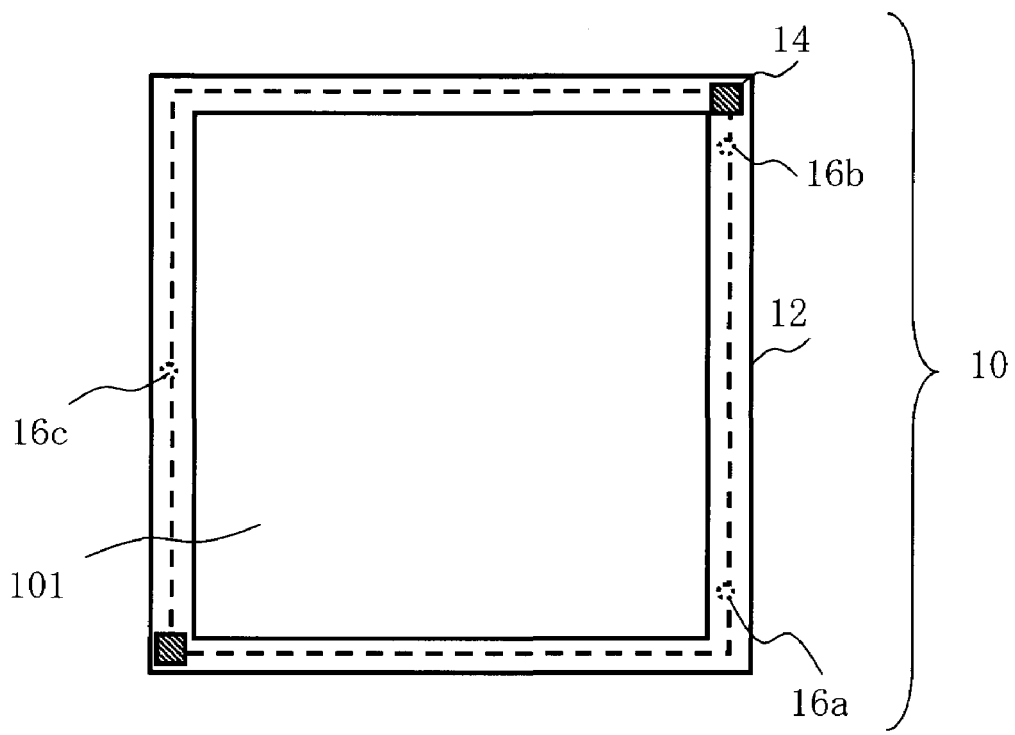
FIG. 1 is a schematic diagram showing a structure of a substrate cover and a substrate described in Embodiment 1.

FIG. 1 is a schematic diagram showing a structure of a substrate cover and a substrate described in Embodiment 1.

Figure 2:
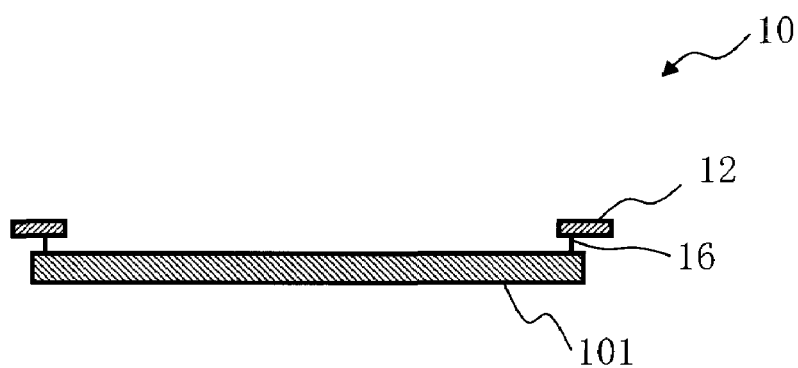
FIG. 2 shows a cross sectional view of the structure of FIG. 1.

FIG. 2 shows a cross sectional view of the structure of FIG. 1. In FIGS. 1 and 2, a substrate cover 10 includes a frame 12 (an example of a frame-like member), a mark 14 for checking a position, and an earth pin 16 used as a contact point part. The frame 12 is comprised of a plate member, and the dimension of its outer perimeter is larger than the perimeter end of a substrate 101, and the dimension of its inner perimeter (that is, the border between the frame 12 and its inner opening portion) is smaller than the perimeter end of the substrate 101. In other words, as shown in FIG. 1, when the substrate cover 10 is placed on the substrate 101, it is formed so that all of the perimeter line of the substrate 101, shown by a dotted line, may overlap with the frame 12. Three earth pins 16 are electrically connected to the substrate 101. Two marks 14 are formed on the frame 12 at the diagonal positions. A substrate cover wholly comprised of a conductive material, a substrate cover which is wholly comprised of an insulating material and whose surface is coated with a conductive material, or the like is suitable for the substrate cover 10. As the conductive material, a metal material, such as copper (Cu), titanium (Ti), or an alloy thereof, is suitable, for example. As the insulating material, a ceramic material etc. is suitable, for example.

Figure 3:
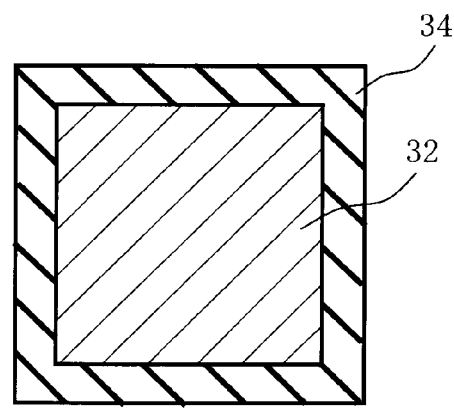
FIG. 3 shows an example of a region of the substrate.

FIG. 3 shows an example of a region of the substrate. In the figure, the substrate 101 includes a writing region 32 at its central part and a substrate perimeter insulating part 34 at the outside of the writing region. The substrate perimeter insulating part 34 is covered with the substrate cover 10 to be overlapped with each other.

Figure 4:
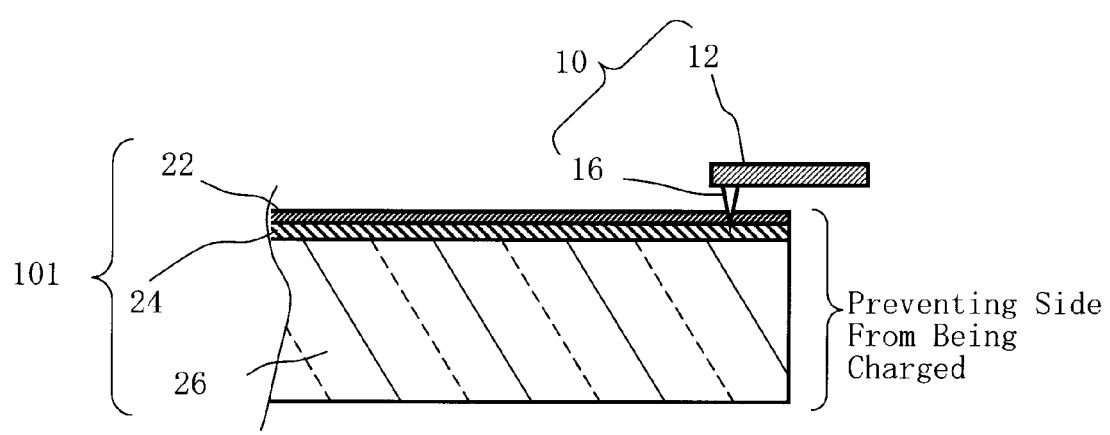
FIG. 4 is a schematic diagram describing an earthing system according to Embodiment 1.

FIG. 4 is a schematic diagram describing an earthing system for coupling a substrate to ground potential according to Embodiment 1. As shown in the figure, the substrate 101 to be written includes a chromium (Cr) film 24 of a conductive material comprising a shading film layer, formed on a glass substrate 26 serving as a mask blank, and a resist film 22 thereon. A desired resist pattern can be formed by applying an electron beam onto the resist film 22. At the time of the electron beam writing the earth pin 16 is connected to the charged chromium film 24, penetrating the resist film 22. Therefore, it is desirable for the tip of the earth pin 16 to be sharp. For example, a conic tip of the earth pin 16 may be inserted into the resist film 22. When setting the substrate 101 which is attached with the substrate cover 10 to the pattern writing apparatus mentioned later and applying electron beams downward to the substrate, since the upper part of the perimeter of the substrate 101 is covered with the frame 12, the covered region can be shielded from the electron beam. Therefore, by attaching the substrate cover 10, it becomes possible to prevent the side of the substrate 101 from being charged. As to the earth pin 16, a conductive member may be separately connected to it in order to couple or "connect" the earth pin 16 to ground potential. As a result, the earth pin 16 can couple the charged electric conduction layer of the substrate 101 to ground potential. The earth pin 16 serves as an example of a contact point part. By providing the substrate cover 10 with the earthing system, it becomes possible to take the earthing system out of the pattern writing apparatus, with the substrate 101.

Figure 5:
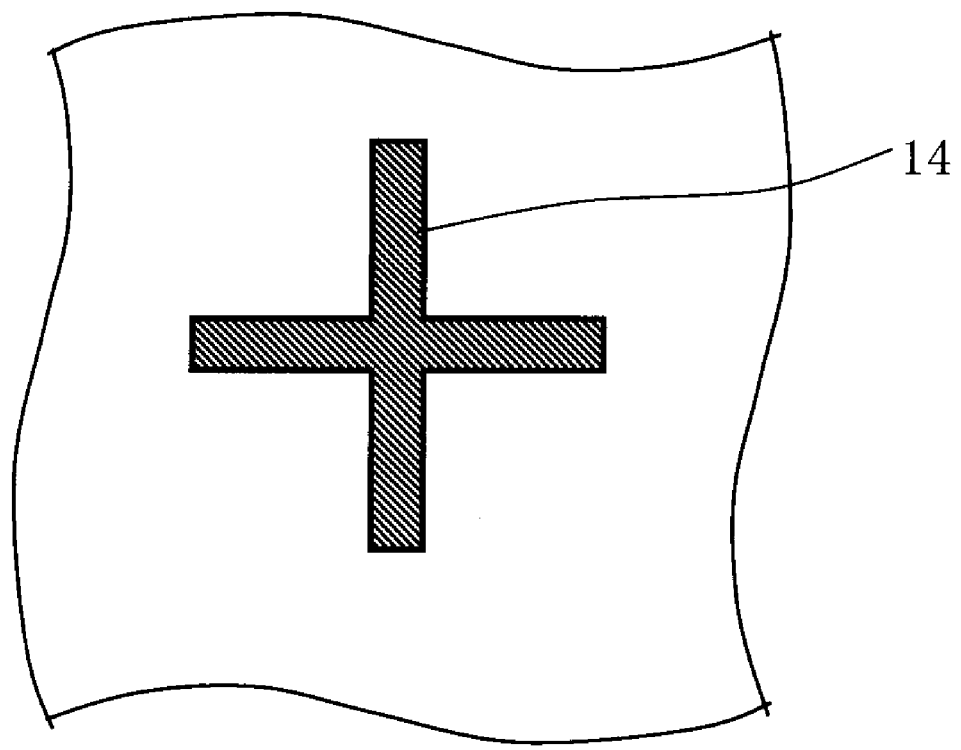
FIG. 5 shows an example of a mark described in Embodiment 1.

FIG. 5 shows an example of the mark 14 described in Embodiment 1. A cross type mark as shown in FIG. 5, for example is suitable as the mark 14. The central position of the mark 14 can be specified by scanning electron beams on the vertical and horizontal lines of the mark 14 when setting the substrate in the pattern writing apparatus. It is desirable for the mark to be made of a metal material, and the mark may be formed to be convex or concave.

Figure 6:
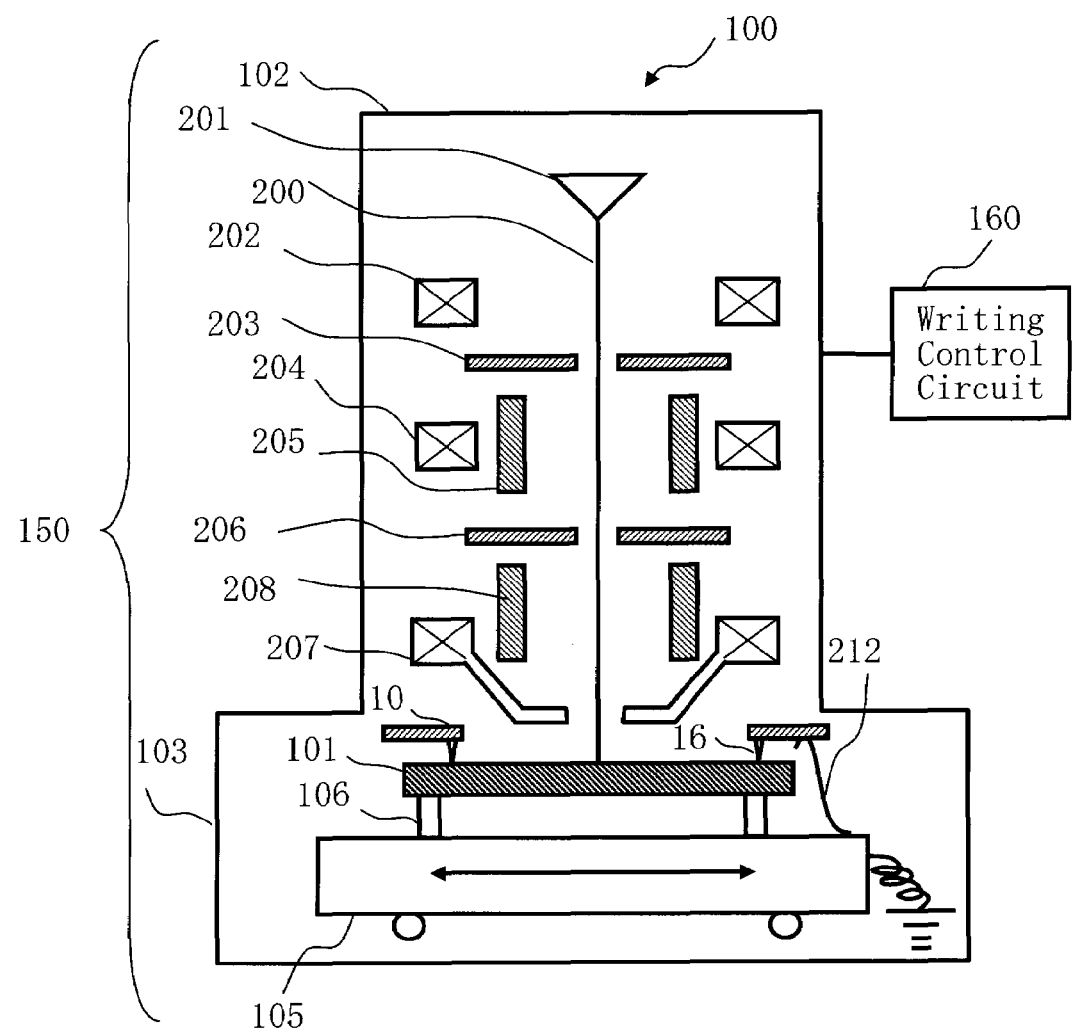
FIG. 6 is a schematic diagram showing a structure of a pattern writing apparatus described in Embodiment 1.

FIG. 6 is a schematic diagram showing a structure of a pattern writing apparatus described in Embodiment 1. In the figure, a pattern writing apparatus 100 serving as an example of the charged particle beam writing apparatus includes a pattern writing unit 150 and a writing control circuit 160. The pattern writing unit 150 includes an electron lens barrel 102 and a writing chamber 103. The electron lens barrel 102 includes an electron gun assembly 201, an illumination lens 202, a first aperture plate 203, a projection lens 204, a deflector 205, a second aperture plate 206, an objective lens 207, and a deflector 208. In the writing chamber 103, an XY stage 105 is arranged. The substrate 101 serving as a target workpiece is supported by support pins 106 on the XY stage 105. The substrate 101 having already been covered with the substrate cover 10 outside the apparatus is carried into the pattern writing apparatus 100 and placed on the XY stage 105. In this case, the substrate 101 is simply supported by three support pins 106. Moreover, a spring member 212 (an example of an electric conductive member) formed of a conductive material is placed on the XY stage 105, and is electrically connected to the earth pin 16 of the substrate cover 10. Potential of the electric charge having moved to the earth pin 16 from the substrate 101 is connected to ground, through the spring member 212 and the XY stage 105. In FIG. 6, a flat spring is used as the spring member 212. Thus, by using the spring member, the impact produced by the substrate cover 10 colliding with the spring member 212 and the thrust from the spring member 212 caused by a position error can be absorbed by the spring member 212 which bends against them. As a result, it becomes possible to prevent the substrate cover 10 from unfastening from the substrate 101. Moreover, a poor electrical connection can be prevented by making the spring member 212 connect while being pressed by a compression force. In order to prevent the substrate cover 10 from unfastening from the substrate 101, it is desirable for the spring constant to be small enough to avoid poor electrical connection. While only the structure elements necessary for explaining Embodiment 1 are shown in FIG. 6, it should be understood that other structure elements generally necessary for the pattern writing apparatus 100 may also be included.

It is desirable to arrange the positions of the three earth pins 16 of the substrate cover 10 to be the same as those of the support pins 106, or to be close to them. Flexure of the substrate 101 can be controlled by arranging the positions of the earth pins 16 that contact with the substrate 101 to be the same as or to be close to those of the support pins 106 that support the substrate from the backside, compared with the case of arranging them at distant positions.

Figures 7A, 7B:
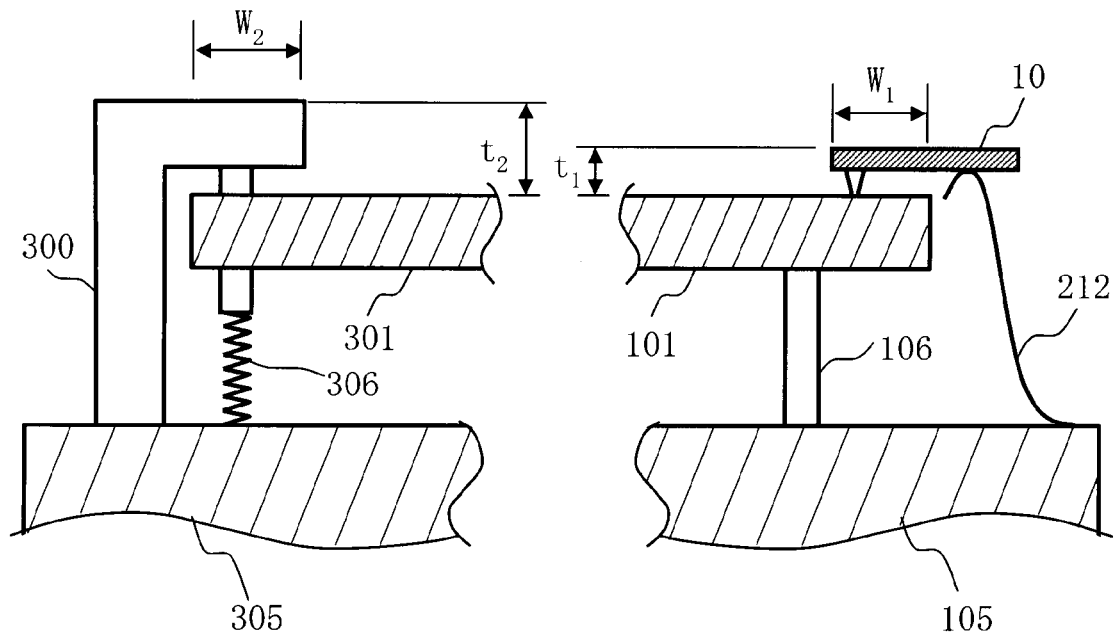
FIG. 7A is a schematic diagram showing a case supported by a clamping mechanism.
FIG. 7B is a schematic diagram showing the structure according to Embodiment 1.

Generally, the substrate 101, such as a mask substrate, is fixed on the stage by using a member, such as a clamping mechanism, in the pattern writing apparatus 100. FIGS. 7A and 7B are schematic diagrams for comparing the case supported by a clamping mechanism with the structure of Embodiment 1. In the clamping mechanism shown in FIG. 7A, in order to clamp the substrate 301, it is necessary to form a structural member 300 having a certain height above the substrate 301. The substrate 301 is clamped between the structural member 300 and a spring support members 306 extending upward from a stage 305. For example, the substrate can be clamped by moving the structural member 300 or the stage 305 up and down. However, as shown in FIG. 6, since the electron lens, such as the objective lens 207, for adjusting the focus of an electron beam 200 is located close to the upside of the substrate 101, it is desired to make the thickness (height) of the member arranged above the substrate 301 be thin (low) as thin as possible. Besides, it is desirable for the structure to be small and simple as much as possible because it is arranged in a narrow space. Then, according to the structure of Embodiment 1 as shown in FIG. 7B, since the substrate 101 is simply supported by the support pin 106 and the substrate cover 10 comprised of a thin tabular frame is just placed, it is possible to make the height of the member arranged above the substrate 101 low. That is, the necessary height $t_1$ above the substrate 101 can be formed lower than the height $t_2$ necessary for the structural member 300 of the clamping mechanism above the substrate 301. Besides, the necessary width $w_1$ from the edge of the substrate 101 to the edge of the substrate cover 10 can be shorter than the necessary width $w_2$ from the edge of the substrate 301 to the edge of the structural member 300 of the clamping mechanism. Moreover, in the case of using the substrate cover 10, since it is enough to just put the substrate covered with the substrate cover 10 on the support pin 106 as a complete arrangement, no complicated structure for making the substrate move up and down, such as the clamping mechanism, is necessary. Though the substrate 101 is simply supported in the structure of Embodiment 1, what is necessary is to make the contact surface between the support pin 106 and the substrate 101 have a friction coefficient durable for the movement acceleration of the XY stage 105.

Figure 8:
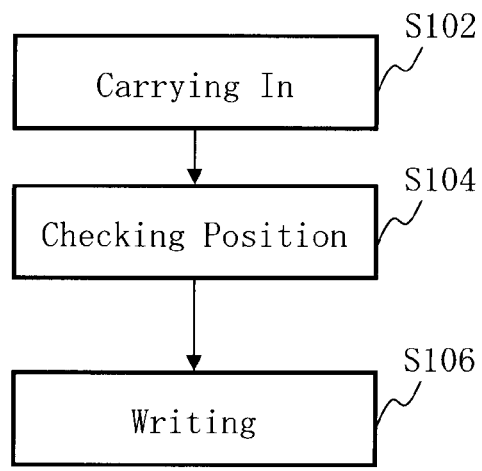
FIG. 8 is a flowchart showing main steps of the writing method according to Embodiment 1.

FIG. 8 is a flowchart showing main steps of the writing method according to Embodiment 1. In the figure, a series of steps, such as a carry-in step (S102), a position check step (S104), and a writing step (S106), are executed.

In S102, as a carry-in step, the substrate 101 attached with the substrate cover 10 is carried into the pattern writing apparatus 100. Since the substrate cover 10 is not the internal structure of the pattern writing apparatus 100, it has the merit of capable of taking it outside the apparatus and of being easy to have maintenance.

In S104, as a position check step, the electron beam 200 scans the mark 14, measures the position of the mark, and checks the position of the substrate 101 by using the measurement result. Since the substrate cover 10 is arranged on the substrate 101, even when the substrate 101 shifts on the XY stage 105, the substrate cover 10 moves unitedly with the substrate 101. Therefore, it is possible to prevent deviation of the relative position between the mark and the substrate which is generated in the conventional case of providing the mark on the stage. Thus, by using the mark 14 formed on the substrate cover 10 united with the substrate 101, since the relative position with respect to the mark does not change even when the substrate 101 shifts from the XY stage 105, the accurate position of the substrate 101 can be specified. Therefore, it is possible to check whether there is a position displacement of the substrate 101 or not. Since the existence of the position displacement of the substrate 101 can be checked at the time of writing, to eliminate a substrate having a pattern error can be executed even during the processing, compared with the conventional case in which the position displacement can be checked only after the processing of development, etching, etc. As a result, a useless step can be reduced. Although one mark may be sufficient as the mark 14, it is more desirable to prepare two or more marks in order to accurately grasp the position of the substrate 101. It is especially preferable to provide the marks diagonally as shown in FIG. 1.

In S106, as a writing step, after checking the position of the substrate 101, a desired pattern is written by applying the electron beam 200 onto the writing region 32 of the substrate 101. Detailed flow of the writing step will be described below.

The electron beam 200, being an example of a charged particle beam, emitted from the electron gun assembly 201 is collected by the illumination lens 202 to irradiate the whole of the first aperture plate 203 having a rectangular opening, for example. This shape of the rectangular opening may also be a square, a rhombus, a rhomboid, etc. At this point, the electron beam 200 is shaped to be a rectangle. Then, after having passed through the first aperture plate 203, the electron beam 200 of a first aperture image is guided by the projection lens 204 to reach the second aperture plate 206. The position of the first aperture image on the second aperture plate 206 is controlled by the deflector 205, and thereby the shape and size of the beam can be changed. After having passed through the second aperture plate 206, the electron beam 200 of a second aperture image is focus-adjusted by the objective lens 207 and deflected by the deflector 208, to reach a desired position on the target workpiece 101 placed on the XY stage 105 which is movably arranged. The inside of the electron lens barrel 102 and the writing chamber 103 wherein the XY stage is arranged is exhausted by a vacuum pump (not shown), and controlled to be vacuum atmosphere whose pressure is lower than atmospheric pressure.

As mentioned above, by applying the electron beam 200 onto the substrate 101 in the state of the whole perimeter part of the substrate 101 being covered with the substrate cover 10, the electron beam to reach the side of the substrate 101 can be shielded by the substrate cover 10. Accordingly, electrification to the side of the substrate 101 can be prevented. Therefore, deviation of the beam orbit caused by the electrified charge on the side of the substrate side can be prevented. Therefore, since the substrate cover is attached to the substrate and moves unitedly with the substrate, the accurate position of the substrate can be checked. As a result, a poor substrate wherein displacement has been generated can be eliminated at the early stage.

As the position check step mentioned above, the position of the mark may be measured not only before the writing start but also after the writing. Moreover, since the writing is executed for each predetermined unit (for example, a writing stripe), it is preferable to measure the mark position for each of this writing unit to check the position.

Embodiment 2

Figure 9:
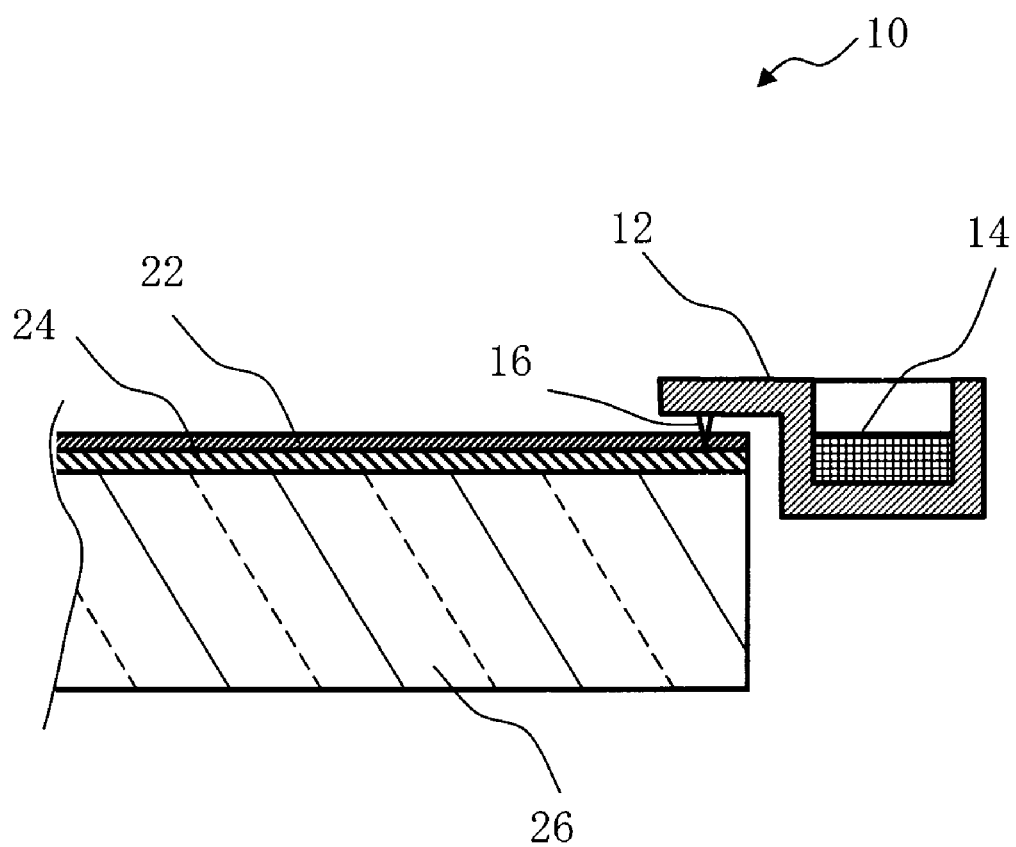
FIG. 9 is a schematic diagram showing a structure of the substrate cover and the substrate described in Embodiment 2.

FIG. 9 is a schematic diagram showing a structure of the substrate cover and the substrate described in Embodiment 2. According to Embodiment 2, the height position of the mark 14 of the substrate cover 10 is structured to be the same as that of the front surface of the substrate 101, i.e., the surface height of the resist film 22. In FIG. 9, there is provided a downwardly projecting thick part at the outer part of the frame 12, and the height position of the mark 14 is adjusted by using this thick part. Thus, by making the height position of the mark 14 be the same as that of the surface of the substrate 101, it becomes possible to grasp the position of the substrate 101 more highly accurately based on the value of the measured mark position.

The thick part at the outer part of the frame 12 may be formed over the whole perimeter of the frame 12, or may be formed only at the position of the mark 14. Moreover, the thick part and the frame 12 may be formed unitedly, or may be connected each other after being formed separately. Other structure is the same as that of Embodiment 1.

Embodiment 3

Figure 10:
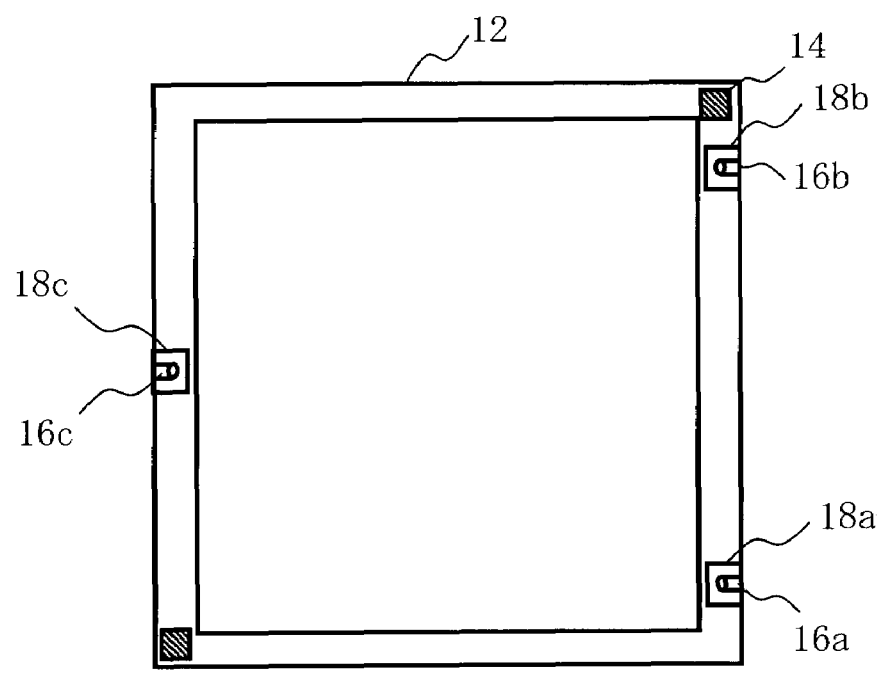
FIG. 10 is a schematic diagram showing a structure of the substrate cover described in Embodiment 3.

FIG. 10 is a schematic diagram showing a structure of the substrate cover described in Embodiment 3. In Embodiments 1 and 2, there is provided the structure in which the earth pin 16 and the main part of the frame 12 are electrically connected. In Embodiment 3, insulating members 18 are arranged respectively at the three positions of the earth pins 16 of the frame 12, and each earth pin 16 is arranged in each insulating member 18 to make the earth pin 16 be insulated from the main part of the frame 12. The earth pin 16 and the frame 12 are separately coupled to ground potential respectively. This structure enables to know whether the electrically charged main body of the frame 12 was coupled to ground potential, or the charged Cr layer was coupled to ground potential through the earth pin 16. This method makes it possible to control each electric potential individually. As to the spring member 212, when arranged in the pattern writing apparatus 100, it is enough to prepare the spring members 212 for the earth pins 16 and for the frame 12 main body. Other structure is the same as that of Embodiment 1.

Embodiment 4

Figure 11:
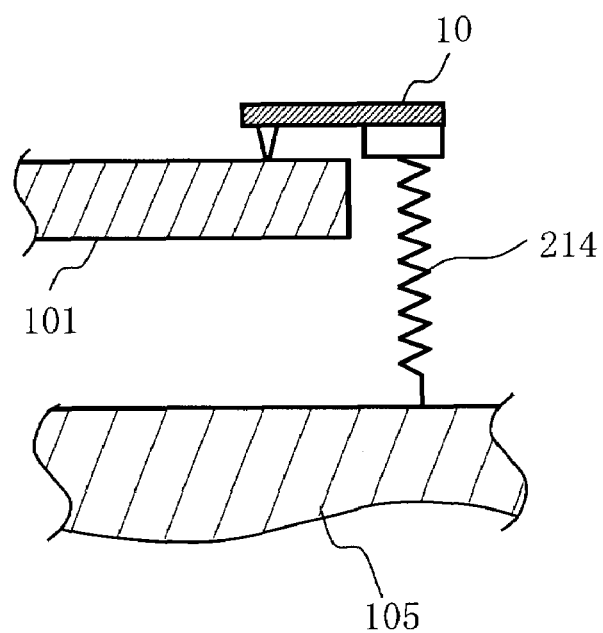
FIG. 11 is a schematic diagram showing a state where a substrate attached with a substrate cover is carried into a pattern writing apparatus described in Embodiment 4.
Figure 12:
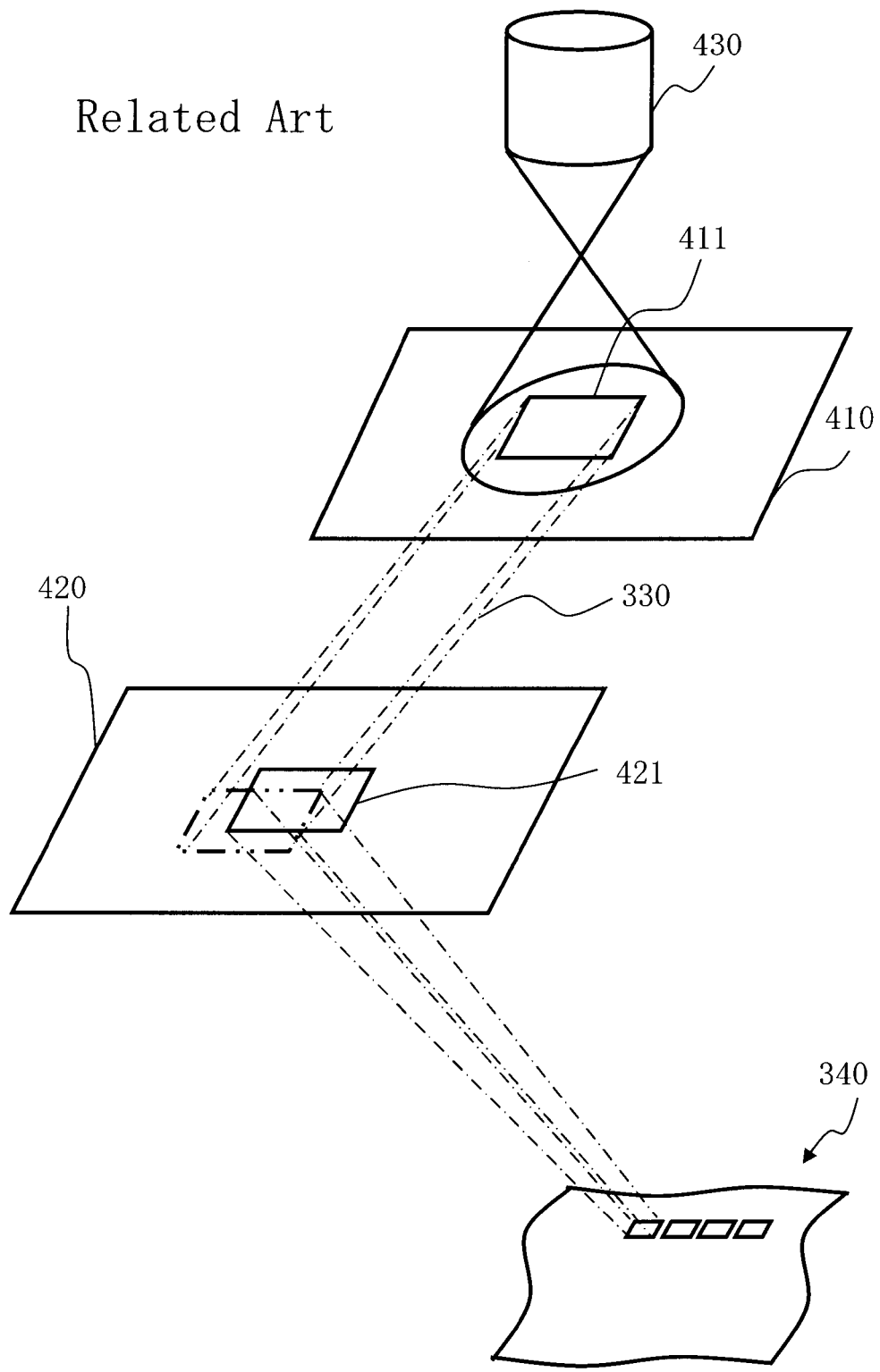
FIG. 12 is a schematic diagram for explaining operations of a conventional variable-shaped electron beam writing apparatus.

FIG. 11 is a schematic diagram showing a state where the substrate attached with the substrate cover is carried into the pattern writing apparatus described in Embodiment 4. In the above Embodiments 1 to 3, when the substrate 101 attached with the substrate cover 10 is arranged in the pattern writing apparatus 100, an earth connection is made by the spring member 212 formed of a flat spring member. In Embodiment 4, as shown in FIG. 11, an earth connection is made by a spring member 214 formed of a spiral spring member. Thus, it is acceptable to use a spring member other than the flat spring member, for making an earth connection. Other structure is the same as that of Embodiment 1.

The embodiments have been described with reference to the concrete examples. However, the present invention is not limited thereto. For example, in each Embodiment mentioned above, a spring member, such as the spring member 212 and the spring member 214, is used to make an earth connection, but it is not restricted thereto. A member capable of making an earth connection will be applied.

While the parts or units not directly necessary for explaining the present invention, such as the structure of the apparatus and the control methods, are not described, it is possible to suitably select and use some or all of them when needed. For example, though the description of the structure of the control unit for controlling the pattern writing apparatus 100 is omitted, it should be understood that required structures of the control unit can be appropriately selected and used.

In addition, any substrate cover, charged particle beam writing apparatus, and charged particle beam writing method that include elements of the present invention and that can be appropriately modified by those skilled in the art are included within the spirit and scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A substrate cover comprising:
   a frame-like member configured to be placed on a substrate which is to be written using a charged particle beam, and to have an outer perimeter dimension larger than a perimeter end of the substrate and an inner perimeter dimension, being a border between the frame-like member and an inner opening portion, smaller than the perimeter end of the substrate; and
   a contact point part configured to be provided on an undersurface of the frame-like member, in order to be electrically connected to the substrate.

2. The substrate cover according to claim 1, wherein the substrate cover includes a predetermined mark formed on the frame-like member.

3. The substrate cover according to claim 1, wherein the substrate cover is formed of conductive material.

4. The substrate cover according to claim 3, wherein the conductive material is metal material.

5. The substrate cover according to claim 1, wherein the substrate cover is formed of insulating material and a surface thereof is coated with conductive material.

6. The substrate cover according to claim 5, wherein the insulating material is ceramic material.

7. A charged particle beam writing apparatus comprising:
a stage configured to hold thereon a substrate attached with a substrate cover covering a whole perimeter part of the substrate and including a contact point electrically connected to the substrate;
an electric conductive member configured to be electrically connected to the contact point and couple the substrate charged to ground potential, in a state that the substrate is arranged on the stage; and
a writing unit configured to write a predetermined pattern onto the substrate by using a charged particle beam, in a state that the substrate is coupled to ground potential by using the electric conductive member.

8. The writing apparatus according to claim 7, wherein the substrate cover includes a frame-like member configured to have an outer perimeter dimension larger than a perimeter end of the substrate and an inner perimeter dimension, being a border between the frame-like member and an inner opening portion, smaller than the perimeter end of the substrate, wherein a predetermined mark is formed on an uppersurface of the frame-like part member.

9. A charged particle beam writing method comprising:
carrying a substrate attached with a substrate cover with a predetermined mark formed thereon into a pattern writing apparatus;
checking a position of the substrate by using the predetermined mark formed on the substrate cover; and
writing a predetermined pattern on the substrate whose position has been checked, by using a charged particle beam.

10. A charged particle beam writing method comprising:
carrying a substrate attached with a substrate cover that covers a whole perimeter part of the substrate into a pattern writing apparatus; and
writing a predetermined pattern on the substrate attached with the substrate cover, by using a charged particle beam.

* * * * *